Dec. 17, 1968 TAKESHI ONUMA ET AL 3,416,979

METHOD OF MAKING A VARIABLE CAPACITANCE SILICON DIODE WITH HYPER ABRUPT JUNCTION

Filed Aug. 13, 1965

Takeshi Onuma
Takeshi Terasaki
INVENTORS

BY Wenderoth, Lind and Ponack

ATTORNEYS 3,416,979
Patented Dec. 17, 1968

3,416,979

METHOD OF MAKING A VARIABLE CAPACITANCE SILICON DIODE WITH HYPER ABRUPT JUNCTION

Takeshi Onuma, Kadoma-shi, and Takeshi Terasaki, Neyagawa-shi, Japan, assignors to Matsushita Electric Industrial Co., Ltd., Osaka, Japan Filed Aug. 13, 1965, Ser. No. 479,572
Claims priority, application Japan, Aug. 31, 1964, 39/50,070; Dec. 19, 1964, 39/73,711
5 Claims. (Cl. 148—178)

ABSTRACT OF THE DISCLOSURE

A hyper abrupt junction silicon diode comprising a silicon wafer—of p-type silicon and with a specific resistivity of 9 to 30 ohm-cm.—and an alloy dot (Sn:Sb:Al=300–800:25–65:1)

Figure 1:
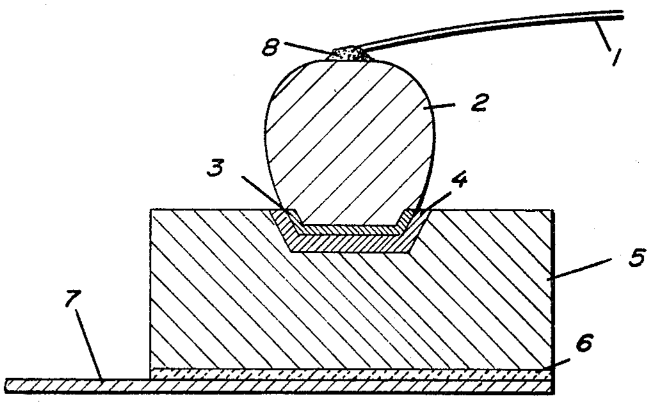

alloyed thereto via an interposed diffusion layer, is made by heating superposed silicon wafer and alloy dot in vacuum at 400° C. to 850° C. and then heating the obtained wetted combination of alloy dot and wafer in a non-oxidizing atmosphere at 900° to 1100° C. to achieve diffusion of Al from the dot into the silicon with production of the interposed diffusion layer, and finally furnace cooling the resultant product. The alloy may also contain 1 to 10% by weight of Au, Ag or Si.

This invention relates to a variable capacitance diode which is sensitive to applied reverse voltage. Particularly, this invention relates to a variable capacitance silicon diode which is of the hyper abrupt junction type and is prepared by alloy-diffusion technique, and still more particularly to a composition ratio of an alloy dot which is an indispensable component of the diode, and to a combination of the composition ratio of the alloy dot and specific resistivity of silicon when the diode is applied to an automatic medium wave tuning element.

The capacitance of variable capacitance diodes varies non-linearly with applied reverse voltage and this characteristic has a high potential for many applications such as parametric amplification, frequency modulation, tuning, and so on. Generally the representation of $C \propto V^{-n}$ is possible, wherein C is the capacitance of the diode, V is the applied reverse voltage and $n$ is a constant.

The variable capacitance diodes are divided into three classes: (1) graded junction type, (2) abrupt junction type and (3) hyper abrupt junction type. The diodes of type 1 are characterized by the relation $C \propto V^{-1/3}$ and are formed by a well known diffusion technique. The diodes of type 2 are characterized by the relation $C \propto V^{-1/2}$ and are formed by a usual alloy technique. The diodes of type 3 are characterized by the relation $C \propto V^{-n}$ wherein $n$ is higher than ½, and are formed by an alloy-diffusion technique. The hyper abrupt junction diodes of type 3 are most advantageous among the three type diodes when they are used for automatic tuning because the hyper abrupt junction diodes have the largest capacitance variation ratio for the same variation of applied reverse voltage. Hyper abrupt junction silicon diodes have a wider operating temperature range and lower reverse current than do germanium hyper abrupt junction diodes.

The silicon diode comprises (1) a semiconductive p-type silicon wafer, (2) an alloy dot consisting of trivalent metal acting as an acceptor, pentavalent metal acting as a donor and carrier metal which is neutral in semiconductive property, (3) a silicon recrystallized region containing said metals, namely, an n-type region and (4) a diffusion layer formed in the silicon wafer successively to said silicon recrystallized region, namely, a p-type region of graded acceptor distribution. A detailed construction of said silicon diode will be explained in the following description with reference to a drawing. The recrystallized region and the diffusion layer are formed by heating a combination of silicon wafer and alloy dot at high temperatures in a neutral or reducing atmosphere, and characterized by a composition of silicon incorporated with the trivalent and pentavalent metals in a desired concentration and distribution.

P-type silicon semiconductor is suitable for formation of the hyper abrupt junction because in silicon the diffusion coefficient of Group III elements defined by the periodic table generally is higher than that of Group V elements. During an alloy-diffusion process, metal of Group III diffuses into p-type silicon and forms a graded type distribution of acceptor. The cooling process makes it possible to establish a recrystallized region of homogeneous donor distribution when the alloy composition has a higher content of metal of Group V than metal of Group III.

The formation of the hyper abrupt junction requires two conditions: (1) that the concentration of donor is very much higher than that of acceptor in the recrystallized region and (2) that the concentration of acceptor at an interface between the recrystallized region and the diffused layer is higher than that of the starting p-type silicon mass. The former is achieved by controlling the proportion ratio of metal of Group III to that of Group V in the alloy, and the latter, by superposition of diffused Group III metal onto the starting p-type silicon mass. Prior literature teaches that a variation in capacitance with applied reverse voltage of a hyper abrupt junction relates to a ratio of starting bulk acceptor concentration to acceptor concentration at an interface between the n-type region and the p-type region and that both the acceptor concentration and diffusion length have an effect on the applied reverse voltage at which the variation ratio of capacitance is a maximum.

In the preparation of a silicon hyper abrupt junction, wettability between silicon and alloy is of primary importance. Generally the wettability of silicon is poorer than that of germanium and is influenced by the oxidation of the alloy dot and the silicon surface during heating. The wettability indefinitely relates to both the diffusion length of the impurity in the diodes and the junction areas which are responsible for the electrical properties of diodes, especially capacitance, variation ratio of capacitance, break-down voltage and hence reverse current.

Of secondary importance is that the thermal expansion coefficient of the alloy be essentially the same as that of silicon. A different coefficient may cause cracking near the junction and may increase the reverse current of the junction and electrical noise when the diode is in practical operation.

Also of importance are the mechanical properties of the alloy. Metal of Group V is usually brittle and its content in the alloy is required to be higher than that of metal of Group III for the reasons mentioned above. Accordingly, an alloy consisting of only metals from Groups III and V is brittle and results in difficulty in making alloy dots of a desired size. The brittleness is improved by addition of carrier metal such as Sn, Pb, Ag and Au.

The present invention contemplates an improved silicon diode comprising a combination of p-type semiconductive silicon and alloy consisting of Sn, Sb and Al in a weight ratio of Sn:Sb:Al=300–800:25–65:1, said combination being heated at 400° C. to 850° C. under reduced pressure ranging from $10^{-4}$ to $10^{-6}$ mm. Hg for attainment of excellent wetting of silicon and alloy, being then fired at 900° C. to 1100° C. in hydrogen or neutral (non-oxidizing) atmosphere, and finally furnace-cooled in said atmosphere for information of the hyper abrupt junction.

It is an object of the present invention to provide an alloy composition satisfying the above requirement for achievement of a hyper abrupt junction silicon diode characterized by a low reverse current, a high capacitance variation ratio and a desirable quality factor Q.

It is another object of the invention to provide a new process for the preparation of hyper abrupt junction silicon diodes having the above said characteristics, in a high production yield.

It is a further object of the invention to provide a new variable capacitance diode which is applicable as an automatic medium wave tuning device.

It is a still further object of the present invention to provide a novel combination of silicon having a specified specific electrical resistivity and alloy composition consisting of Sn, Al and Sb.

Figure 2:
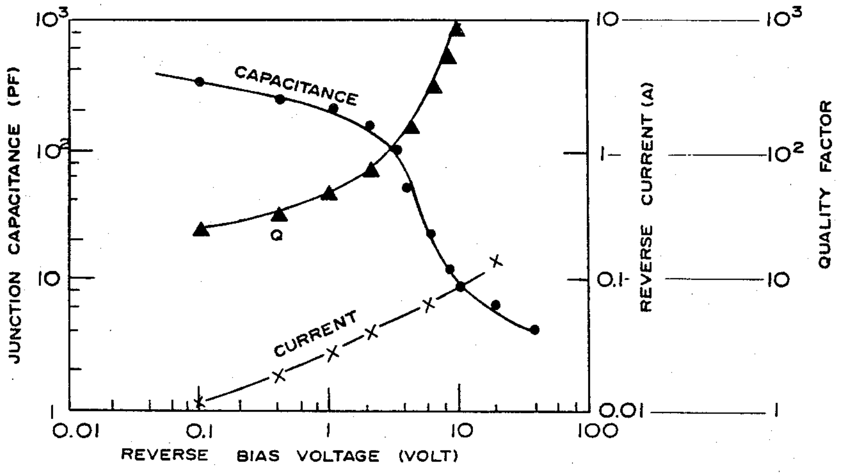

Referring to the accompanying sheet of drawings,

FIG. 1 is a sectional view of a variable capacitance diode according to the present invention; and FIG. 2 is a graphical showing of the characteristics of capacitance, reverse current and Q factor, hereinafter identified, as a function of reverse bias voltage.

Referring first to FIG. 1, reference numeral 4 designates a diffusion layer obtained by heating a combination of p-type silicon 5 and an alloy dot 2 in a way contemplated by the invention.

Recrystallized region 3 is formed by alloying of silicon wafer 5 and said alloy 2 during heat treatment. The silicon wafer is provided with a molybdenum electrode 7 by using an Al-Si eutectic solder 6. Lead wire 1 is applied to said alloy 2 by means of a conventional solder 8.

It has been found that wetting of silicon and alloy consisting of Sn, Sb and Al in a weight ratio of Sn:Sb:Al=300–800:25–65:1 is successfully achieved under reduced pressure in air at temperatures of 400° C. to 850° C. Heating in hydrogen or neutral gas atmosphere such as argon gives a poor wetting.

When the wetting characteristics of various carrier metals such as Ag, Au, Pb, Sn and Ag-Pb in a constant weight percentage relationship of Al and Sb are examined by optical microscopic observation after heating a combination of silicon wafer and alloy dot, there are obtained the results shown in Table 1, indicating that the alloy including Pb as carrier metal shows good wettability initially and thereafter gradually is subjected to oxidation which causes a poor flatness of the junction and cracking adjacent the junction. The alloying material including Ag causes cracking adjacent the junction, resulting from the different expansion coefficient and hardness relative to those of silicon. Alloy consisting of Sn, Al and Sb has a melting point ranging from 300° C. to 450° C. depending on its composition. The alloy has a high resistance to oxidation which directly relates to the wettability.

TABLE 1

| | Wetting | Crack | Flatness of the junction |
|---|---|---|---|
| Ag | + | ---------- | − |
| Au | + | + or − | + |
| Ag, Pb | +− | ---------- | ---------- |
| Pb | +− | − | +− |
| Sn | + | + | + |

NOTE: +=Good; −=Poor; +−=Initially good and finally poor with time.

Another discovery is that better wetting and electric characteristics are obtained by adding a small amount of Au, Ag or Si to the alloy consisting of Sn, Sb and Al. It is suitable to add 1∼10 wt. percent of at least one metal selected from Au, Ag and Si.

It is very important to obtain a large variation ratio of capacitance when the diode is applied to the automatic tuning of radio waves, especially low frequency waves. For example, where the whole frequency range of medium waves is to be covered, the variation ratio of capacitance needs to satisfy the following:

$$\frac{C_{max.}+C_s}{C_{min.}+C_s}=\left(\frac{f_{max.}}{f_{min.}}\right)^2 \geqq 9.4 \qquad (1)$$

where $C_{max}$=the maximum value of capacitance which appears at the allowable minimum voltage (pico-farads).

$C_{min}$=the minimum value of capacitance which appears at the allowable maximum voltage (pico-farads).

$C_s$=the stray capacitance (pico-farads).

$f_{max}$=the maximum radio wave frequency (cycles per second).

$f_{min}$=the minimum radio wave frequency (cycles per second).

A variation ratio of capacitance higher than 9.4 is achieved with the hyper abrupt junction diode working at an applied voltage lower than 10 v., whereas it is achieved by the abrupt junction diode working at about 90 v. of applied voltage, and by the graded junction diode at higher than 90 v.

An automatic tuning device also requires a diode having a high quality factor Q and breakdown voltage. A high quality factor at medium wave and higher frequency requires a decrease in the series resistance of the diode, that is, a low specific resistivity of silicon (an increase in the original acceptor concentration of silicon bulk), whereas a high breakdown voltage needs a high specific resistivity of silicon (a decrease in said concentration). As taught in the prior literature, the variation in capacitance with applied reverse voltage of a hyper abrupt junction depends on the ratio of acceptor concentration at the starting p-type silicon bulk to acceptor concentration at the interface between n- and p-type regions and accordingly increases with an increase in the concentration of Al of the alloy and equivalently in specific resistivity of p-type silicon.

Silicon of low specific resistivity is applicable for the hyper abrupt junction having a high concentration of the acceptor at the interface between n- and p-type regions, which is obtained by an increase in the content of Al in the alloy. The increase in Al content requires an increase in the content of Sb, which consequently results in a decrease in the content of Sn. The decrease in the content of Sn causes brittleness of the alloying material. Of importance therefore is a minimum quantity of Sn to satisfy the above requirement.

According to the present invention, it has been discovered that an alloy of weight composition ratio of Sn to Sb lower than 4.6 is difficult to be fabricated into dots because of its brittleness. An increase in the content of Sn results in a soft alloy which is easily fabricated into dots but also in difficulty of control of a small content of Al. However, it is easy to control the small amount of Al of an alloy in a weight ratio of Sn to Al less than 800.

In the alloy diffusing process, the alloy dot on the silicon wafer melts and slightly eats into the silicon and the Al diffuses into the silicon wafer from the eaten part. A high diffusion temperature accordingly is accompanied by a high diffusion coefficient of Al which causes an increase in the acceptor concentration at the interface between the n- and p-type regions. The diffusion length of Al is determined by the diffusing time and diffusion coefficient. A diffusion at high temperature makes the control of diffusion length difficult because a high diffusion coefficient needs a short diffusion time. In accordance with the present invention the temperature range of 900 to 1100° C. is desirable. Furthermore, when the alloy diffusion process is undertaken under reduced pressure at high temperature, evaporation of Sb causes a decrease in concentration of Sb at the vicinity of the junction and prevents the formation of the hyper abrupt junction. It has been discovered, according to the present invention, that a weight ratio of Sb to Al higher than 5.5 is desirable for a production of the silicon hyper abrupt junction diode. It is necessary for this purpose that in the alloy composition: the weight fraction of Sn be greater than 4.6 times that of Sb; the weight fraction of Sn be less than 800 times that of Al; and the weight fraction of Sb be greater than 5.5 times that of Al. In accordance with the present invention it has been found that the most suitable weight proportion is in a range of Sn:Sb:Al=300–800:25–65:1

The following examples illustrate the practice of this invention. Since the weight fraction of Al is much smaller than that of Sn, it is necessary to prepare initially a mother alloy of Sn and Al for controlling accurately the weight fraction of Al of the resulting alloy material. The mother alloy consisting of 90 wt. percent of Sn and 10 wt. percent of Al is prepared by mixing the ingredients in a grain form of high purity, heating and stirring the mixture in a carbon tube at 500 to 600° C. for 20 minutes in argon gas and water-quenching. For obtaining a desirable composition of the resulting alloy consisting of Sn, Sb and Al, a required amount of Sn and Sb is added to the mother alloy in a similar way to that of the mother alloy preparation. For instance, an alloy ingot with a weight ratio Sn:Sb:Al=400:50:1 can be made by mixing 39.1 grams of Sn, 5 grams of Sb and 1 gram of mother alloy. An alloy dot is obtained by cutting out a pellet from the resulting alloy in an appropriate size and globing it by a per se well-known method. A p-type silicon wafer having a specific resistivity of 20 ohm-cm. is prepared by lapping, cleaning, chemical etching, rinsing with a deionized water and drying, according to a per se well-known method. Wetting is carried out by heating the alloy dot on the silicon wafer under reduced pressure, $3\times10^{-5}$ mm. Hg, at 600° C. for 20 minutes. Thereafter a combination of dots and silicon wafers is heated in $H_2$ up to 1000° C. and maintained at that temperature for 15 to 30 minutes to form hyper abrupt junctions. Thereafter, a variable capacitance diode is produced by contacting electrodes in a per se conventional way.

When an alloy dot is of a composition ratio by weight, Sn:Sb:Al=400:50:1, a combination of the alloy dot 1 millimeter in diameter and a silicon wafer of 100$\mu$ thickness produces a hyper abrupt junction diode whose capacitance is 200 pf. at 1 v. of applied reverse voltage and 9 pf. at 10 v. FIG. 2 shows an example of characteristics of capacitance, reverse current and Q as a function of reverse bias voltage. A variation ratio defined by the Equation 1, supra, is about 11 for the above combination when a stray capacitance equals 10 pf. 1000 samples of this kind of diode exhibit reverse currents lower than 1$\mu$a. and 90% of them shows a reverse current lower than 0.2$\mu$a. at 10 v. of applied reverse voltage. The wetting characteristics are successfully achieved in a yield higher than 99%.

When an alloy dot is in a weight proportion of Sn:Sb:Al=450:60:1, 968 silicon diodes comprising a combination of said alloy dot of 1 millimeter in diameter and a silicon wafer of 100$\mu$ thickness exhibit reverse currents lower than 1.4$\mu$a. and 84% of them have reverse currents lower than 0.2$\mu$a. at 10 v. while keeping a yield higher than 97% in performance of desirable wetting characteristics.

Hyper abrupt junction silicon diodes satisfying the Equation 1 are fabricated by a combination of silicon wafers in various specific resistivities and alloy dots in various compositions in a similar way to that described in the preceding example.

Table 2 shows the yield of a diode characterized by a variation ratio of capacitance higher than 9.4, and a reverse current lower than 0.2$\mu$a. at 10 v. of applied reverse voltage. Table 3 shows the yield of a diode characterized by a quality factor Q of 40 at 500 kc./s. at 200 pf.

It will be understood from Table 2 and Table 3 that silicon diodes suitable for automatic tuning elements of medium wave are prepared in a high yield by a combination of p-type silicon having 7 to 30 ohm-cm. of electrical resistivity and an alloy consisting essentially of a composition indicated by Sn:Sb:Al=300–800:25–65:1 when stray capacitance is less than 10 pf.

TABLE 2

| Weight proportion of ingredients, Sn:Sb:Al | Variation ratio of capacitance $\frac{C_{max.}+10\text{ pf.}}{C_{min.}+10\text{ pf.}}=9.4$ | | | | | | | | | Reverse current (<0.2$\mu$a. at 10 v.) |
|---|---|---|---|---|---|---|---|---|---|---|
| | Specific resistivity of p-type silicon (ohm, cm.) | | | | | | | | | |
| | 3 | 5 | 7 | 10 | 15 | 20 | 25 | 30 | 35 | |
| 300:25:1 | −−− | −−− | − | 0 | + | + | ++ | ++ | +++ | 0 |
| 280:25:1 | −− | −− | − | 0 | + | + | ++ | ++ | +++ | 0, or − |
| 300:20:1 | −−− | −−− | −− | − | 0, or + | + | + | ++ | +++ | 0 |
| 300:65:1 | −− | − | 0, or + | + | + | + | ++ | ++ | +++ | 0, or + |
| 280:65:1 | − | − | 0, or + | + | + | + | ++ | ++ | +++ | − |
| 300:70:1 | − | − | 0, or + | + | + | + | ++ | ++ | +++ | − |
| 800:25:1 | −−− | −−− | −− | 0, or − | 0, or + | + | + | ++ | ++ | + |
| 830:25:1 | −−− | −−− | −− | 0, or − | 0, or + | + | + | ++ | ++ | ++ |
| 800:20:1 | −−− | −−− | −− | 0, or − | 0, or + | + | + | ++ | ++ | ++ |
| 800:65:1 | −−− | −−− | −− | 0, or − | 0, or + | + | + | + | ++ | ++ |
| 830:65:1 | −−− | −−− | −− | − | 0 | + | + | + | + | ++ |
| 800:70:1 | −−− | −−− | −− | 0, or − | 0 | 0 | + | + | ++ | ++ |

TABLE 3

| Weight proportion of ingredients, Sn:Sb:Al | Quality factor, Q≧40 (at 200 pf., 500 kc./s.) | | | | | | | | |
|---|---|---|---|---|---|---|---|---|---|
| | Specific resistivity of p-type silicon (ohm, cm.) | | | | | | | | |
| | 3 | 5 | 7 | 10 | 15 | 20 | 25 | 30 | 35 |
| 300:25:1 | ++ | ++ | ++ | ++ | ++ | ++ | + | + | + |
| 280:25:1 | ++ | ++ | ++ | ++ | ++ | ++ | ++ | + | + |
| 300:20:1 | ++ | ++ | ++ | ++ | ++ | ++ | ++ | + | +, or 0 |
| 300:65:1 | ++ | ++ | ++ | ++ | ++ | ++ | ++ | + | 0 |
| 280:65:1 | ++ | ++ | ++ | ++ | ++ | ++ | ++ | + | 0 |
| 300:70:1 | ++ | ++ | ++ | ++ | ++ | ++ | + | + | − |
| 800:25:1 | ++ | ++ | ++ | ++ | + | 0, or + | 0 | 0, or − | − |
| 830:25:1 | ++ | ++ | ++ | ++ | 0 | 0, or + | 0 | 0 | −− |
| 800:20:1 | ++ | ++ | ++ | ++ | + | + | + | − | − |
| 800:65:1 | ++ | ++ | ++ | ++ | + | + | 0 | 0, or − | − |
| 830:65:1 | ++ | ++ | ++ | ++ | + | 0, or + | + | 0 | − |
| 800:70:1 | ++ | ++ | ++ | ++ | ++ | + | + | − | − |

NOTE.—In Tables 2 and 3: +++=90% up, ++=80–90%, +=70–80%, −=60–70%, −−=50–60%, −−−=50% down, 0: spreading over + and −.

What is claimed is:

1. A method of producing a hyper abrupt junction silicon diode comprising a silicon wafer and alloy dot alloyed thereto through the medium of an interposed diffusion layer, said silicon wafer being p-type silicon having a specific resistivity of 7 to 30 ohm-cm., and said alloy being an alloy of tin, antimony and aluminum in a weight proportion Sn:Sb:Al=300–800:25–65:1, said method comprising heating superposed silicon wafer and alloy dot under reduced pressure ranging from $10^{-4}$ to $10^{-6}$ mm. Hg at 400° C. to 850° C., whereby the alloy dot is wetted to the silicon wafer, and thereafter heating the wetted combination of alloy dot and wafer in a non-oxidizing atmosphere at 900° to 1100° C., whereby diffusion of Al from said dot into said silicon with production of said interposed diffusion layer takes place, and finally cooling the resultant product.

2. A method according to claim 1 wherein the alloy is an alloy of tin, antimony and aluminum in a weight proportion Sn:Sb:Al=400–450:50–60:1.

3. A method according to claim 1 wherein said reduced pressure is $3 \times 10^{-5}$ mm. Hg.

4. A method according to claim 1, wherein said alloy further contains 1 to 10% by weight of a member selected from the group consisting of Au, Ag and Si.

5. A method acocrding to claim 2, wherein said alloy further contains 1 to 10% by weight of a member selected from the group consisting of Au, Ag and Si.

References Cited

UNITED STATES PATENTS

| | | | |
|---|---|---|---|
| 2,937,961 | 5/1960 | Wolsky | 148—181 |
| 3,078,195 | 2/1963 | Tummers et al. | 148—33.6 |
| 3,121,828 | 2/1964 | Im. | |
| 3,235,419 | 2/1966 | Beale et al. | 148—181 XR |
| 3,243,325 | 3/1966 | Shinoda | 148—185 XR |
| 3,258,371 | 6/1966 | Sukegawa et al. | 148—178 XR |
| 3,307,088 | 2/1967 | Fujikawa et al. | 317—234 |

L. DEWAYNE RUTLEDGE, *Primary Examiner.*

PAUL WEINSTEIN, *Assistant Examiner.*

U.S. Cl. X.R.

148—181, 185, 33.1, 33.6; 317—234, 235